United States Patent
Hsieh (10) Patent No.: US 8,717,109 B2
(45) Date of Patent: May 6, 2014

(54) TEMPERATURE INVARIANT CIRCUIT AND METHOD THEREOF

(75) Inventor: Hong-Yean Hsieh, Santa Clara, CA (US)

(73) Assignee: Realtek Semiconductor Corp., Hsinchu (TW)

(*) Notice: Subject to any disclaimer, the term of this patent is extended or adjusted under 35 U.S.C. 154(b) by 285 days.

(21) Appl. No.: 12/630,255

(22) Filed: Dec. 3, 2009

(65) Prior Publication Data
US 2011/0133846 A1    Jun. 9, 2011

(51) Int. Cl.
*H03L 1/04* (2006.01)
*H03B 1/00* (2006.01)

(52) U.S. Cl.
USPC ............ 331/70; 331/66; 331/69; 331/117 FE; 331/167; 331/176

(58) Field of Classification Search
USPC .................. 331/66, 69, 70, 117 FE, 167, 176
See application file for complete search history.

(56) References Cited

U.S. PATENT DOCUMENTS

| | | | | |
|---|---|---|---|---|
| 4,639,578 A * | 1/1987 | Payne | ......................... | 219/468.2 |
| 5,534,987 A * | 7/1996 | Ohtsuka et al. | ................. | 399/69 |
| 5,789,722 A * | 8/1998 | Zimmerman et al. | ........ | 219/486 |
| 5,903,799 A * | 5/1999 | Saito et al. | ....................... | 399/69 |
| 6,462,614 B2 * | 10/2002 | Yoon et al. | ..................... | 327/552 |
| 6,825,681 B2 * | 11/2004 | Feder et al. | .............. | 324/750.07 |
| 7,112,767 B2 * | 9/2006 | Lee | ................ | 219/492 |
| 7,283,008 B2 * | 10/2007 | Fujita | ............................ | 331/176 |
| 2003/0227336 A1 * | 12/2003 | Wang et al. | .................... | 331/100 |
| 2005/0104674 A1 * | 5/2005 | Norman et al. | .................. | 331/65 |
| 2007/0030020 A1 * | 2/2007 | Kinsley | .......................... | 324/760 |
| 2007/0290871 A1 * | 12/2007 | Farley et al. | ................... | 340/635 |
| 2007/0296527 A1 * | 12/2007 | Lutz et al. | ...................... | 333/186 |
| 2008/0098615 A1 * | 5/2008 | Kim | ................................. | 34/493 |
| 2008/0247252 A1 * | 10/2008 | Ruf et al. | ....................... | 365/211 |
| 2009/0021311 A1 * | 1/2009 | Grewing et al. | ................. | 331/34 |
| 2009/0216388 A1 * | 8/2009 | Ito | ................................. | 700/299 |
| 2010/0278211 A1 * | 11/2010 | Pu et al. | ......................... | 374/57 |

* cited by examiner

*Primary Examiner* — Arnold Kinkead
*Assistant Examiner* — Richard Tan
(74) *Attorney, Agent, or Firm* — McClure, Qualey & Rodack, LLP (57) ABSTRACT

A temperature invariant digitally controlled oscillator is disclosed. The digitally controlled oscillator is configured to generate an output clock with stable frequency. The temperature invariant digitally controlled oscillator comprises a digitally controlled oscillator, a temperature sensor, a temperature decision logic circuit, and a temperature conditioner. The digitally controlled signal is provided to adjust the oscillation frequency of the digitally controlled oscillator by changing its capacitances. The stabilization of the silicon temperature is achieved with the temperature sensor, the temperature decision logic circuit, and the temperature conditioner.

16 Claims, 8 Drawing Sheets

TEMPERATURE INVARIANT CIRCUIT AND METHOD THEREOF

BACKGROUND OF THE INVENTION

1. Field of the Invention

The present invention relates generally to electrical circuits, and more particularly but not exclusively to circuit elements for adjusting the oscillation frequency of a controlled oscillator.

2. Description of the Background Art

In a digitally controlled oscillator, the operating frequency is adjusted by enabling or disabling a number of tuning circuit elements. The tuning circuit elements can be any components and circuits, such as transistor or varactor. A tuning circuit element is enabled and disabled by setting its binary control signal to a binary one and a binary zero, respectively. Because of the binary nature of the control signal, the oscillation frequency of the digitally controlled oscillator is quite insensitive to the variations of power supply voltages. On the other hand, the oscillation frequency of the digitally controlled oscillator is still sensitive to the ambient temperature variations. The temperature influence on the oscillation frequency of the digitally controlled oscillator is of interest. In a typical digitally controlled oscillator, the oscillation frequency can differ by more than 1% over 100° C. temperature variations.

In order to provide a stable reference clock over voltage variations, a digitally controlled oscillator is employed. A method and an apparatus are provided in the present invention to adjust the silicon temperature close to a predetermined value such that the oscillation frequency of the digitally controlled oscillator is less sensitive to the changes of the ambient temperature in any case.

SUMMARY

The present invention pertains to make the oscillation frequency of a digitally controlled oscillator stable. In one embodiment, a temperature invariant digitally controlled oscillator is configured to receive a digitally controlled signal and a power down signal and to generate an output clock with stable frequency. The temperature invariant digitally controlled oscillator comprises a digitally controlled oscillator, a temperature sensor, a temperature decision logic circuit, and a temperature conditioner. The digitally controlled signal is provided to adjust the oscillation frequency of the digitally controlled oscillator by changing its capacitances. The stabilization of the silicon temperature is achieved with the temperature sensor, the temperature decision logic circuit, and the temperature conditioner. When the silicon temperature is higher than a pre-determined value, the temperature decision logic circuit adjusts the settings of the temperature conditioner to reduce the silicon temperature. When the silicon temperature is lower than a pre-determined value, the temperature decision logic circuit adjusts the settings of the temperature conditioner to increase the silicon temperature.

In one method, the silicon temperature is confined around a pre-determined value. The temperature sensor continues monitoring the silicon temperature and reports the current reading. The temperature decision logic circuit compares the reading with the pre-determined value. If the reading is greater than the pre-determined value, a number of the temperature adjusting elements in the temperature conditioner are enabled to deliver more power. If the reading is less than the pre-determined value, a number of the temperature adjusting elements in the temperature conditioner are disabled to deliver less power.

In another method, the reading from the temperature sensor is recorded when the power down signal is asserted. The temperature sensor continues monitoring the silicon temperature and reports the current reading during power down. The temperature decision logic circuit compares the reading with the recorded value. If the reading is smaller than the recorded value, a number of temperature adjusting elements in the temperature conditioner are enabled to deliver more power. If the reading is larger than the recorded value, a number of temperature adjusting elements in the temperature conditioner are disabled to deliver less power.

After the system exits from the power down mode, the delivered power from the temperature conditioner is gradually restored to its default value. When the system enters into the power down mode again, the temperature adjusting elements are then enabled and disabled in accordance with the disclosed method.

These and other features of the present invention will be readily apparent to persons of ordinary skill in the art upon reading the entirety of this disclosure, which includes the accompanying drawings and claims.

DESCRIPTION OF THE DRAWINGS

The use of the same reference label in different drawings indicates the same or like components.

DETAILED DESCRIPTION

In the present disclosure, numerous specific details are provided, such as examples of electrical circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

In this specification, the temperature invariant digitally controlled oscillator has been provided, it is to be understood that these embodiments are for illustration purposes and not limiting. Persons of ordinary skill in the art will recognize that the invention can be implemented in other applications, circuits.

Figure 1:
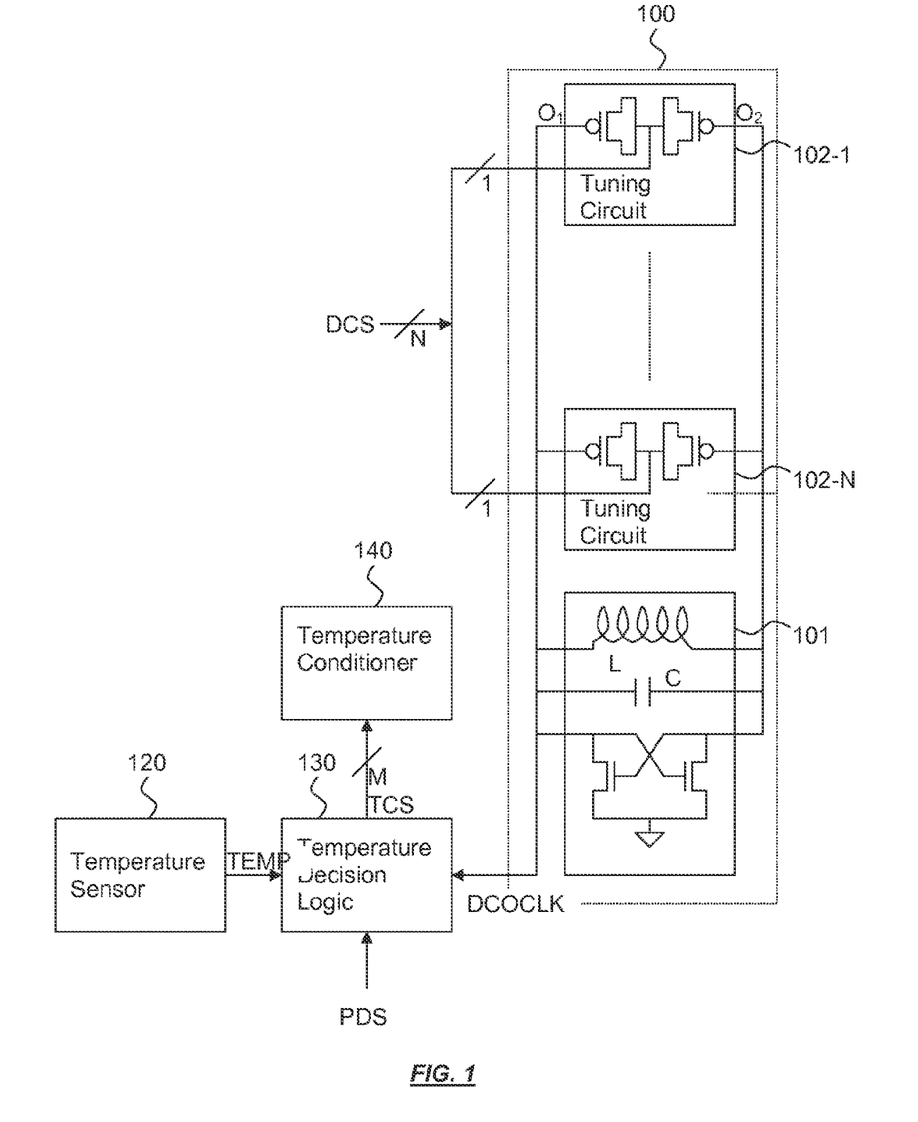
FIG. 1 shows a temperature invariant digitally controlled LC-tank oscillator in accordance with an embodiment of the present invention.

Embodiments of the present invention advantageously allow for fabrication of a temperature invariant digitally controlled oscillator. FIG. 1 shows a temperature invariant digitally controlled oscillator in accordance with an embodiment of the present invention. The temperature invariant digitally controlled oscillator is configured to receive a digitally controlled signal DCS and a power down signal PDS and to generate an output clock DCOCLK with stable frequency. The temperature invariant digitally controlled oscillator comprises a digitally controlled oscillator 100, a temperature sensor 120, a temperature decision logic circuit 130, and a temperature conditioner 140.

Figure 2:
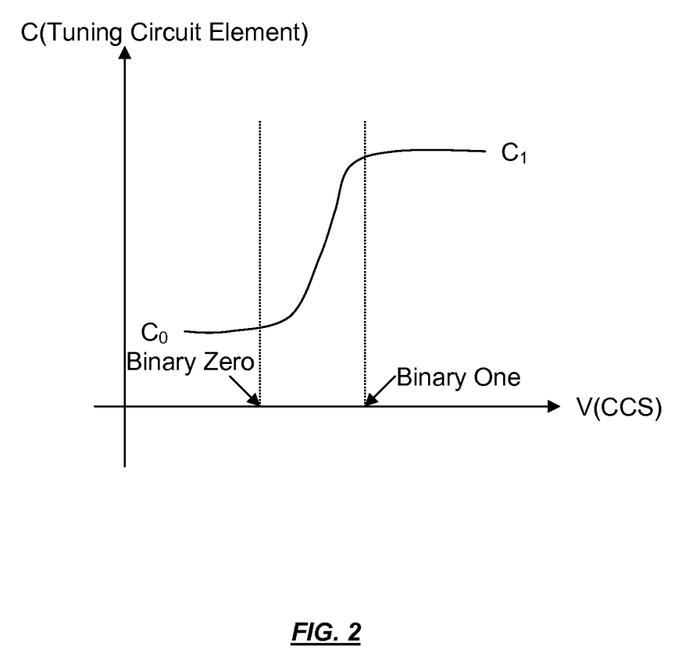
FIG. 2 shows a capacitance versus voltage curve of a tuning circuit element in accordance with an embodiment of the present invention.

In one embodiment, the digitally controlled oscillator 100 is constructed from an inductor-capacitor (LC) tank 101 and a plurality of N tuning circuit elements. The tuning circuit element can be any components and circuits, such as transistors, varactors, or a metal insulated metal. Each tuning circuit element is coupled to the digital control signal (DCS). A tuning circuit element is enabled and has a capacitance $C_1$ when its control signal is equal to a binary one. A tuning circuit element is disabled and has a capacitance $C_o$ when its control signal equal to a binary zero. FIG. 2 shows a capacitance versus voltage curve of a tuning circuit element in accordance with an embodiment of the present invention. The oscillation frequency of the output clock DCOCLK is determined by L, the inductance in the LC-tank 101, C, the capacitance in the LC-tank, and $C_s$, the sum of all the capacitance values of the tuning circuits. The exact formula of the oscillation frequency is $$\frac{1}{\left(2\pi\sqrt{L(C+C_S)}\right)}.$$

Although the values of L, C, and $C_s$ are quite insensitive to the voltage variations in the digitally controlled oscillator 100, they are still sensitive to the temperature variations. In a typical digitally controlled oscillator, the oscillation frequency can differ by more than 1% over 100° C. temperature variations. Out of these three components, $C_s$ has a dominant effect on the oscillation frequency because it includes the parasitic capacitance of the gm-stage in the LC-tank 101.

Figure 3A:
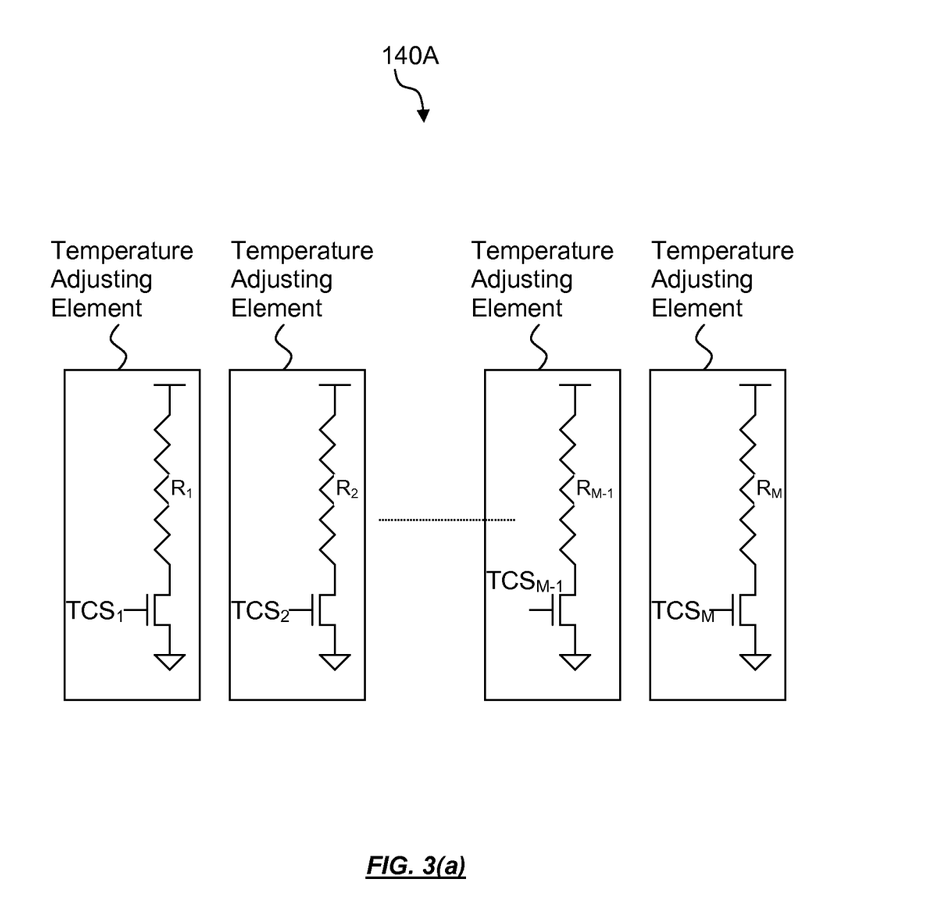
FIG. 3(a) schematically shows a temperature conditioner in accordance with an embodiment of the present invention.

FIG. 3(a) shows a temperature conditioner in accordance with an embodiment of the present invention. The temperature conditioner 140A comprises a plurality of M voltage-mode temperature adjusting elements. Each of said voltage-mode temperature adjusting elements is configured to receive a temperature control signal (TCS). When a temperature control signal is equal to a binary one, the corresponding temperature adjusting element is enabled and delivers a power of $V^2/R_i$ where V is the voltage difference across the resistor $R_i$. When a temperature control signal is equal to a binary zero, the corresponding temperature adjusting element is disabled and delivers a negligible power. The delivered power from the temperature conditioner is equal to the sum of the delivered power of the enabled temperature adjusting elements.

Figure 3B:
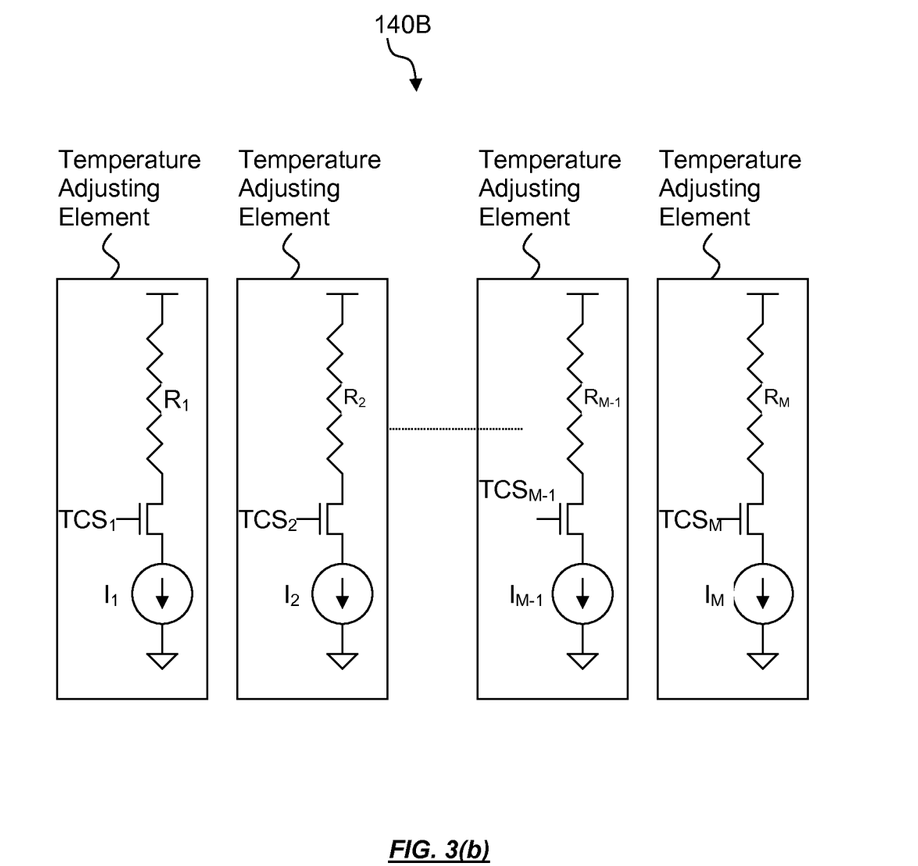
FIG. 3(b) schematically shows a temperature conditioner in accordance with an embodiment of the present invention.

FIG. 3(b) shows a temperature conditioner in accordance with an embodiment of the present invention. The temperature conditioner 140B comprises a plurality of M current-mode temperature adjusting elements. Each of said current-mode temperature adjusting elements is configured to receive a temperature control signal (TCS). When a temperature control signal is equal to a binary one, the corresponding temperature adjusting element is enabled and delivers a power of $I_i^2 \cdot R_i$ where $I_i$ is the bias current flowing through the resistor $R_i$. When a temperature control signal is equal to a binary zero, the corresponding temperature adjusting element is disabled and delivers a negligible power. The delivered power from the temperature conditioner is equal to the sum of the delivered power of the enabled temperature adjusting elements.

In another embodiment, a temperature conditioner comprises a mix of voltage-mode temperature adjusting elements and current-mode temperature adjusting elements.

Figure 4:
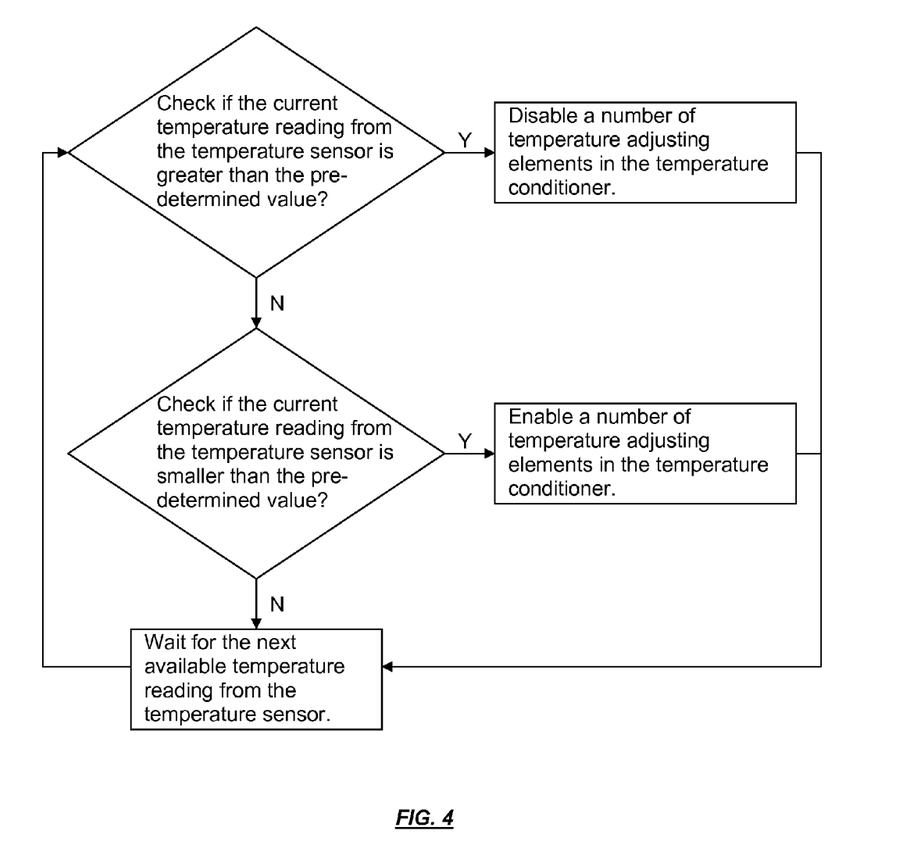
FIG. 4 shows a method to keep temperature invariant in accordance with an embodiment of the present invention.

In one embodiment, an apparatus and a method are provided in the present invention to stabilize the temperature all the time. FIG. 4 shows an algorithm used in the temperature decision logic circuit 130 to enable and disable the plurality of M temperature adjusting elements irrelevant of the value of the power down signal PDS. The method first checks if the current temperature reading from the temperature sensor 120 is greater than a pre-determined value. If yes, a number of temperature adjusting elements in the temperature conditioner 140 are disabled to reduce the delivered power. If not, check if the current temperature reading from the temperature sensor 120 is smaller than the pre-determined value. If yes, a number of temperature adjusting elements in the temperature conditioner 140 are enabled to increase the delivered power. If not, wait for the next available temperature reading from the temperature sensor 120.

In one embodiment, an apparatus and a method are provided in the present invention to stabilize the temperature when the power down signal PDS is asserted. When the power down signal is de-asserted, the oscillation frequency of the digitally controlled oscillator 100 is adjusted in accordance with the digitally controlled signal DCS and the delivered power from the temperature conditioner is kept at its default value.

Figure 5A:
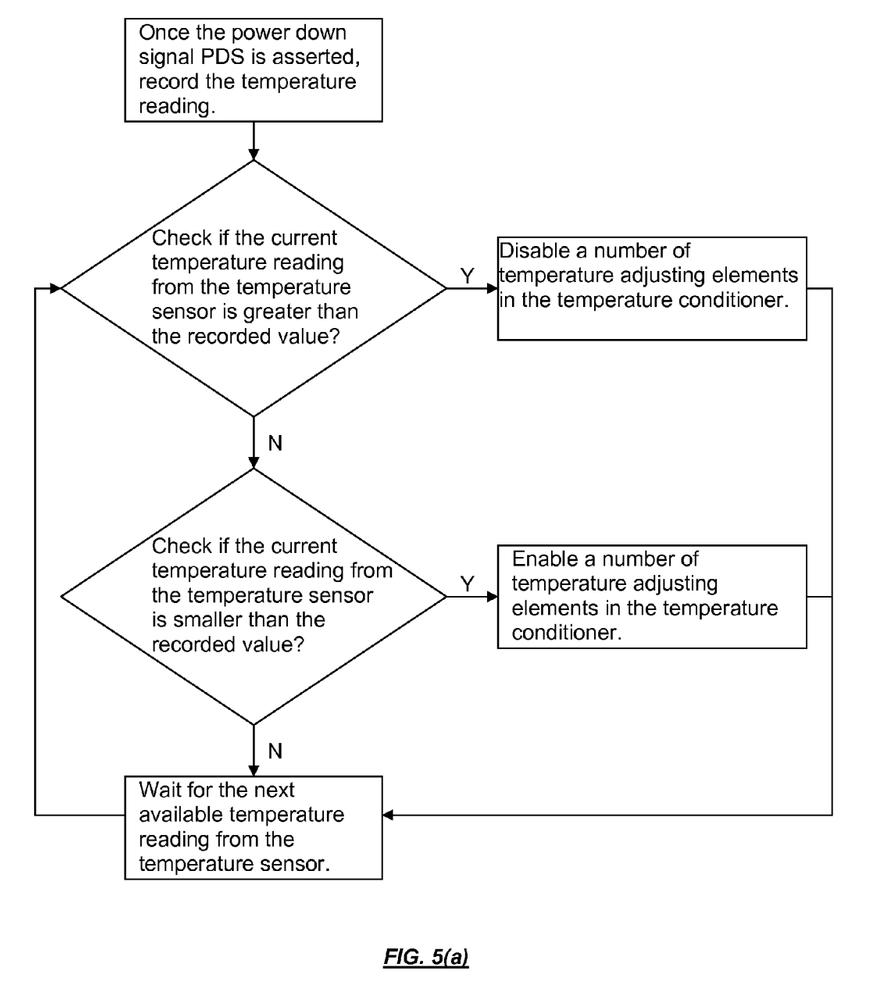
FIG. 5(a) shows a method to keep temperature invariant when a system enters its power down mode in accordance with an embodiment of the present invention.

FIG. 5(a) shows an algorithm used in the temperature decision logic circuit 130 to enable and disable the plurality of M temperature adjusting elements when the power down signal PDS is asserted. Once the power down signal is asserted, the temperature reading from the temperature sensor 120 is recorded. The method continues monitoring the temperature reading from the temperature sensor 120. If the current temperature reading from the temperature sensor 120 is greater than the recorded value, a number of temperature adjusting elements in the temperature conditioner 140 are disabled to reduce the delivered power. If the current temperature reading from the temperature sensor 120 is smaller than the recorded value, a number of temperature adjusting elements in the temperature conditioner 140 are enabled to increase the delivered power. Otherwise, wait for the next available temperature reading from the temperature sensor 120.

Figure 5B:
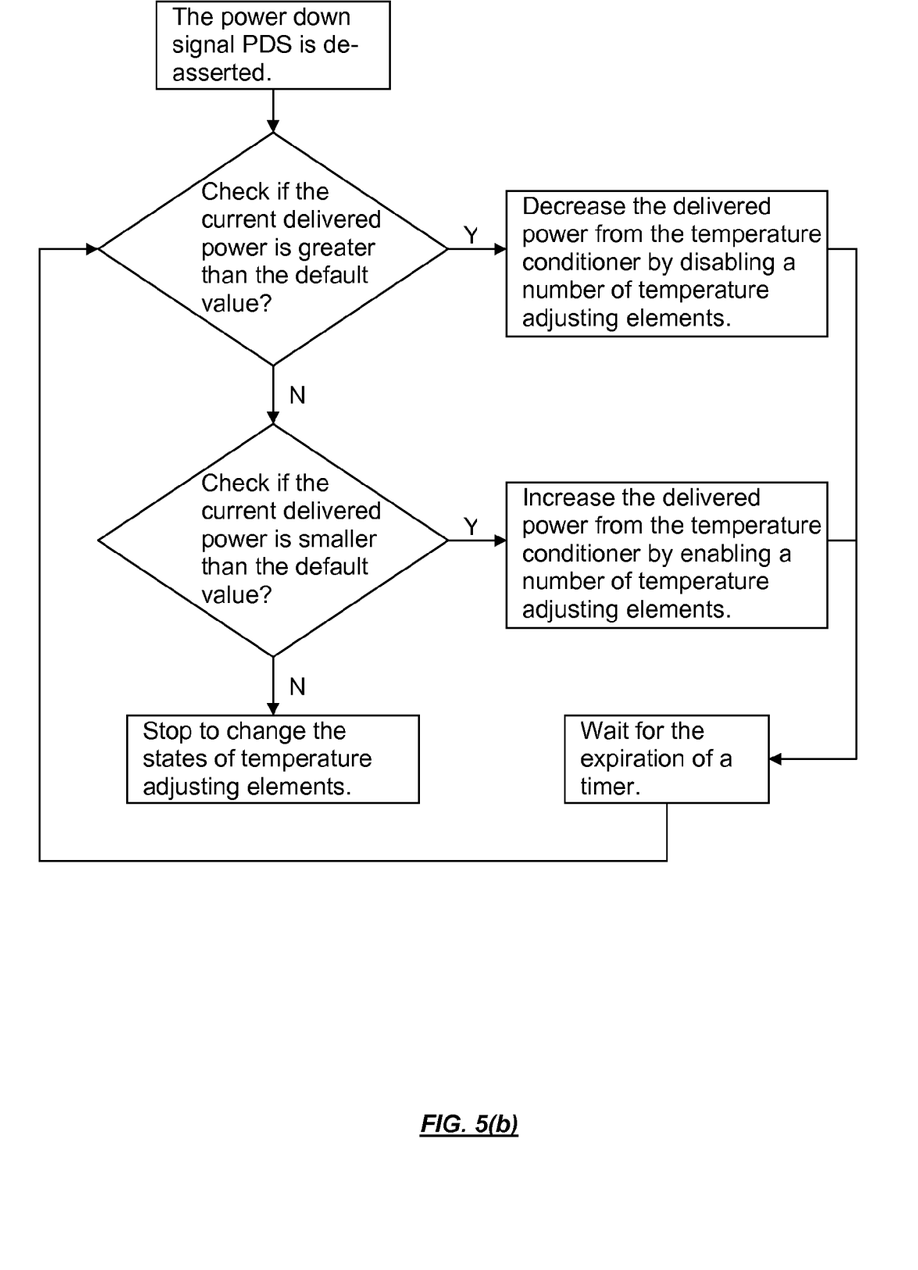
FIG. 5(b) shows a method to restore the default settings of the temperature conditioner when a system exits from its power down mode in accordance with an embodiment of the present invention.

FIG. 5(b) shows an algorithm used in the temperature decision logic circuit 130 to restore the delivered power from the temperature conditioner 140 to its default value after a system exits from the power down mode. Once the power down signal is de-asserted, if the delivered power from the temperature sensor 120 is greater than the default value, a number of temperature adjusting elements in the temperature conditioner 140 are disabled to reduce the delivered power and wait for the expiration of a timer to further reduce the delivered power. If the delivered power from the temperature sensor 120 is smaller than the default value, a number of temperature adjusting elements in the temperature conditioner 140 are enabled to increase the delivered power and wait for the expiration of a timer to further increase the delivered power. Otherwise, it means that the delivered power is equal to its default value and the restoration process stops.

Figure 5C:
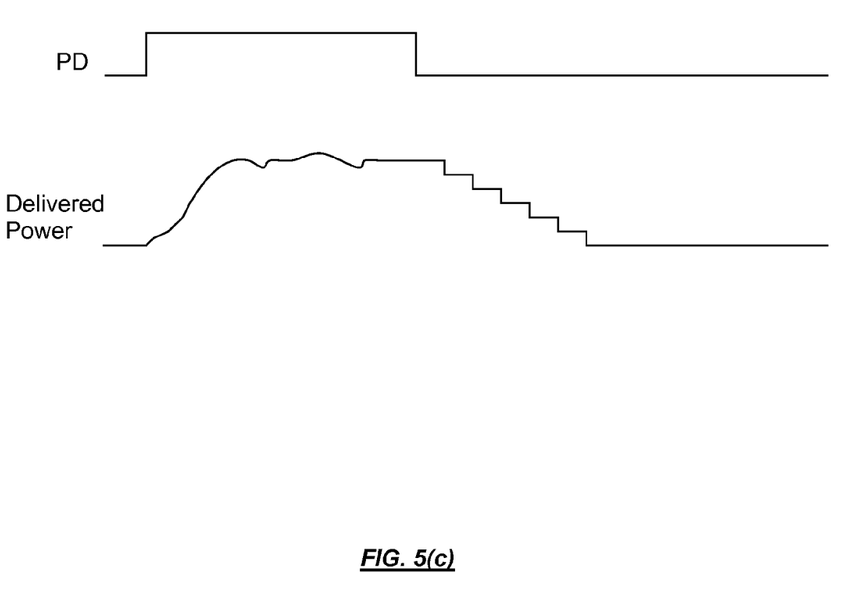
FIG. 5(c) shows a timing diagram of the delivered power from a temperature conditioner as a system enters and exits from its power down mode.

FIG. 5(c) shows a timing diagram of the typical delivered power from a temperature conditioner 140 as a system enters and exits a power down mode. When the system enters the power down mode, some circuits in the system are turned off and the silicon temperature drops. In order to stabilize the silicon temperature, a number of temperature adjusting elements are enabled to deliver more power. When the system exits from the power down mode, the delivered power is gradually reduced to its default value.

A temperature invariant digitally controlled oscillator has been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A temperature invariant circuit comprising:
  an internal circuit configured to generate an output signal, wherein the output signal is sensitive to a silicon temperature;
  a temperature sensor configured to monitor the silicon temperature and output a current temperature signal;
  a decision logic circuit, coupled to the temperature sensor, configured to compare the current temperature signal with a predetermined value to generate a plurality of temperature control signals based on the comparison;
  a temperature conditioner, coupled to the decision logic circuit, configured to increase or reduce the silicon temperature according to the plurality of temperature control signals, wherein the temperature conditioner comprises a plurality of temperature adjusting elements each configured to receive corresponding temperature control signals, and wherein each of said temperature adjusting elements operates in one of a voltage mode or a current mode when enabled; and
  a digitally controlled oscillator comprising an inductor-capacitor (LC) tank and a plurality of tuning circuit elements comprising variable capacitors, wherein an oscillating frequency of the digitally controlled oscillator is based on a capacitance in the LC-tank and a sum of variable capacitance values of the tuning circuit elements;
  wherein a stabilization of the silicon temperature is achieved with the temperature sensor, the decision logic circuit, and the temperature conditioner; and
  wherein an increasing number of temperature adjusting elements is disabled when the temperature invariant circuit exits a power down mode and if a power delivered from the temperature sensor is greater than a default value, wherein the increasing number of temperature adjusting elements are disabled according to a timer.

2. The circuit of claim 1, wherein at least one of the tuning circuit elements is one of a transistor, a varactor, or a metal insulated metal.

3. The circuit of claim 1, wherein each of said temperature adjusting elements is disabled or enabled according to the corresponding temperature control signal.

4. The circuit of claim 3, wherein the decision logic circuit enables and disables the temperature adjusting elements in the temperature conditioner when a power down signal is asserted.

5. The circuit of claim 1, wherein at least one of the temperature adjusting elements is enabled to stabilize the silicon temperature when the temperature invariant circuit enters a power down mode.

6. The circuit of claim 1, wherein an increasing number of temperature adjusting elements is enabled when the temperature invariant circuit exits a power down mode and if a power delivered from the temperature sensor is less than a default value, wherein the increasing number of temperature adjusting elements are enabled according to a timer.

7. A temperature invariant method applied to an integrated circuit, the method comprising:
  detecting a silicon temperature of the integrated circuit to report a current temperature signal;
  comparing the current temperature signal with a predetermined value to generate a plurality of temperature control signals based on the comparison;
  utilizing a temperature conditioner to increase or reduce the silicon temperature according to the temperature control signal, wherein the temperature conditioner comprises a plurality of temperature adjusting elements each configured to receive corresponding temperature control signals, and wherein each of said temperature adjusting elements operates in one of a voltage mode or a current mode when enabled, wherein a stabilization of the silicon temperature is achieved according to the temperature control signals;
  adjusting an oscillation frequency of a digitally controlled oscillator in the integrated circuit by adjusting variable capacitance values of a plurality of tuning elements in the digitally controlled oscillator, wherein the oscillating frequency of the digitally controlled oscillator is based on a capacitance in an inductor-capacitor (LC) tank and the sum of variable capacitance values of the tuning circuit elements; and
  in response to the temperature invariant circuit exiting a power down mode and a power delivered from the temperature sensor being greater than a default value, disabling an increasing number of temperature adjusting elements, wherein the increasing number of temperature adjusting elements are disabled according to a timer.

8. The method of claim 7, wherein at least one of the tuning circuit elements is one of a transistor, a varactor, or a metal insulated metal.

9. The method of claim 7, wherein each of said temperature adjusting elements is disabled or enabled according to the corresponding temperature control signal.

10. The method of claim 9, wherein the temperature adjusting elements are respectively enabled and disabled when a power down signal is asserted.

11. The method of claim 7, wherein the integrated circuit comprises a plurality of temperature adjusting elements, and at least one of the temperature adjusting elements is enabled to stabilize the silicon temperature when the circuit enters a power down mode.

12. The method of claim 7, further comprising:
  in response to the temperature invariant circuit exiting a power down mode and a power delivered from the temperature sensor being less than a default value, enabling an increasing number of temperature adjusting elements, wherein the increasing number of temperature adjusting elements are enabled according to a timer.

13. A temperature invariant circuit comprising:
  an internal circuit configured to generate an output signal corresponding to a silicon temperature;
  a temperature sensor configured to monitor the silicon temperature and output a current temperature signal;
  a decision logic circuit, coupled to the temperature sensor, configured to compare the current temperature signal with a predetermined value to generate a plurality of temperature control signals based on the comparison; and
  a temperature conditioner, coupled to the decision logic circuit, configured to adjust the silicon temperature according to the plurality of temperature control signals, wherein the temperature conditioner comprises a plurality of temperature adjusting elements each configured to receive corresponding temperature control signals, and wherein the decision logic circuit is configured to control operation of a number of temperature adjusting elements among the plurality of temperature adjusting elements; and a digitally controlled oscillator comprising an inductor-capacitor (LC) tank and a plurality of tuning circuit elements comprising variable capacitors, wherein an oscillating frequency of the digitally controlled oscillator is based on a capacitance in the LC-tank and a sum of variable capacitance values of the tuning circuit elements; and wherein an increasing number of temperature adjusting elements is disabled when the temperature invariant circuit exits a power down mode and if a power delivered from the temperature sensor is greater than a default value, wherein the increasing number of temperature adjusting elements are disabled according to a timer.

14. The circuit of claim 13, wherein each of said temperature adjusting elements operates in one of a voltage mode or a current mode when enabled.

15. The circuit of claim 13, wherein each of said temperature adjusting elements operates according to a corresponding bias current.

16. The circuit of claim 15, wherein each of said temperature adjusting elements delivers power when enabled, wherein the delivered power is a function of the corresponding bias current.

* * * * *